United States Patent
Miyatake et al.

[11] Patent Number: 5,079,748
[45] Date of Patent: * Jan. 7, 1992

[54] DYNAMIC RANDOM ACCESS MEMORY WITH READ-WRITE SIGNAL OF SHORTENED DURATION

[75] Inventors: Hideshi Miyatake; Masaki Kumanoya; Hideto Hidaka; Hiroyuki Yamasaki; Yasuhiro Konishi; Yuto Ikeda, all of Hyogo, Japan

[73] Assignee: Mitsubishi Denki Kabushiki Kaisha, Tokyo, Japan

[*] Notice: The portion of the term of this patent subsequent to Jul. 31, 2007 has been disclaimed.

[21] Appl. No.: 469,125

[22] Filed: Jan. 24, 1990

Related U.S. Application Data

[62] Division of Ser. No. 184,256, Apr. 21, 1988, Pat. No. 4,945,517.

[30] Foreign Application Priority Data

May 13, 1987 [JP] Japan .................. 62-117405

[51] Int. Cl.$^5$ .................. G11C 7/00; G11C 11/406; G11C 11/413
[52] U.S. Cl. .................. 365/233; 365/189.01; 365/189.05; 365/203
[58] Field of Search .................. 365/189.01, 233, 203, 365/189.05, 191, 230.08, 230.01

[56] References Cited

U.S. PATENT DOCUMENTS

| | | | |
|---|---|---|---|
| 4,755,964 | 7/1988 | Miner | 365/233 X |
| 4,766,572 | 8/1988 | Kobayashi | 365/233 X |
| 4,794,567 | 12/1988 | Akatsuka | 365/233 X |
| 4,841,488 | 6/1989 | Sanada | 365/189.01 X |
| 4,945,517 | 7/1990 | Miyatake et al. | 365/189.01 |

FOREIGN PATENT DOCUMENTS

0154314A2 9/1985 European Pat. Off. .

OTHER PUBLICATIONS

IEEE Journal of Solid-State Circuits, vol. SC-20, No. 5, Oct. 1985, S. 929-933.

*Primary Examiner*—Alyssa H. Bowler
*Attorney, Agent, or Firm*—Lowe, Price, LeBlanc & Becker

[57] ABSTRACT

A semiconductor dynamic RAM provided with an I/O load (5) rendered inactive during a writing cycle comprises a monostable multivibrator (16) for receiving a read/write indicating signal $\overline{W}$ for indicating reading and writing data from and into a memory cell (2) and outputting a signal $\overline{We}$ having a shorter duration than that of the signal $\overline{W}$ at down edge of the signal $\overline{W}$ as a trigger. The output signal $\overline{We}$ of the monostable multivibrator (16) is supplied as a control signal for rendering the I/O load (5) inactive.

6 Claims, 4 Drawing Sheets

_5,079,748_

DYNAMIC RANDOM ACCESS MEMORY WITH READ-WRITE SIGNAL OF SHORTENED DURATION

This application is a division of application Ser. No. 07/184,256 filed Apr. 21, 1988 now U.S. Pat. No. 4,945,517.

BACKGROUND OF THE INVENTION

1. Field of the Invention

The present invention relates to a dynamic random access memory (referred to hereinafter as dynamic RAM) and particularly to a dynamic RAM capable of performing static operation in columns to fulfill a quick access function.

2. Description of the Prior Art

Most of dynamic RAMs of these days have a quick access function such as a fast page mode or a static column mode in which a cycle time can be decreased to suitably perform high-speed processing required in a memory for image processing or the like. In order to realize such a high-speed mode, a conventional dynamic RAM has columns comprising a static circuit as in a static RAM which does not need to be precharged. In such a conventional dynamic RAM, an input/output (referred to hereinafter as I/O) line for inputting and outputting data is constantly pulled up at a predetermined DC potential through an I/O load. However, if the I/O line is constantly pulled up at the DC potential, the potential on the I/O line can not immediately be lowered because of the existence of the I/O load when data "0" is to be written, and thus it takes time to write data. Therefore, a structure for preventing the above described disadvantage is adopted, in which the I/O load is rendered inactive during a writing cycle so as to be disconnected from a DC power supply (refer to Japanese Patent Laying-Open Gazette No. 60-179993 or IEEE J. Solid-State Circuits, vol. SC-20, pp. 894-902, October 1985).

FIG. 1 is a circuit diagram showing a main part of a conventional dynamic RAM in which the above described structure is adopted. In FIG. 1, a dynamic RAM comprises a sense amplifier 1, a memory cell 2, a write buffer circuit 3, a row decoder 4a, a column decoder 4b, an I/O load 5, a pair of bit lines 6 and 7, a pair of I/O lines 8 and 9, MOS transistors 10 and 11 for switching between the pair of bit lines 6 and 7 and the pair of I/O lines 8 and 9, MOS transistors 12 and 13 constituting the I/O load 5, and a word line 15.

Operation in a writing cycle of the dynamic RAM of FIG. 1 will be described by taking the fast page mode as an example.

As shown in a timing chart of FIG. 2, writing operation is enabled when a row address strobe signal $\overline{RAS}$, a column address strobe signal $\overline{CAS}$ and a write enable signal R/W applied from a CPU are all at a low level.

First, when the row address strobe signal $\overline{RAS}$ changes to the low level, a row address is selected by the row decoder 4a and a word line 15 corresponding thereto attains a high level. When data appears to a given extent from the memory cell 2 connected to the word line 15 as a potential difference between the bit lines 6 and 7, the sense amplifier 1 is activated whereby one of the potentials of the bit lines 6 and 7 is amplified to a source potential Vcc and the other is set to a ground potential GND. Subsequently, when the column address strobe signal $\overline{CAS}$ changes to the low level, the column decoder 4b is activated and a selected output Yi of the column decoder 4b attains the high level. As a result, gates of the MOS transistors 10 and 11 are opened, whereby the pair of bit lines 6 and 7 are connected with the pair of I/O lines 8 and 9. Thus, even in the writing cycle, the same operation as in a reading cycle is effected at an early stage of the writing cycle. In this state, data is written forcedly into the memory cell 2.

Subsequently, the following operation is performed. When the write enable signal R/W is turned to the low level, a read/write indicating signal $\overline{W}$ is turned to the low level in the dynamic RAM. The signal $\overline{W}$ is commonly applied to gates of the MOS transistors 12 and 13 of the I/O load 5 and to the write buffer circuit 3. Accordingly, when the output of the signal $\overline{W}$ is turned to the low level, the I/O load 5 is rendered inactive, whereby the pair of I/O lines 8 and 10 are disconnected from the DC source. At the same time, the write buffer circuit 3 is activated. When write data $D_{in}$ is supplied to the write buffer 3, the write buffer circuit 3 sets one of the I/O lines 8 and 9 to a high level approximate to the source potential Vcc and sets the other to a low level equal to the ground potential GND, dependent on "0" or "1" of the data $D_{in}$. Those potential levels are transmitted to the pair of bit lines 6 and 7 through the pair of I/O lines 8 and 9. On that occasion, if the write data is different from the data already stored in the memory cell 2, that is, if data of "1" previously stored in the memory cell 2 is renewed and data of "0" is written therein for example, the potential level of the bit line 6 becomes slightly lower than that of the other bit line 7. As a result, the output level of the sense amplifier 1 is inverted, whereby the bit line 6 is set to the ground potential GND and the other bit line 7 is set to the source potential Vcc. Thus, writing of data into the memory cell 2 is completed.

In the dynamic RAM having the above described structure, one of the I/O lines 8 and 9 is set to the potential approximate to the source potential and the other is set to the ground potential in the data writing cycle, while in the data reading cycle, the output level of the sense amplifier 1 does not need to be inverted and the I/O lines 8 and 9 are set to almost the same potential. Accordingly, if one data writing cycle is completed for example, it is necessary to charge the I/O line of the low level to a predetermined potential (as indicated by $V_{ct}$ in FIG. 2) so that the dynamic RAM is prepared for the subsequent reading or writing cycle. However, the I/O lines 8 and 9 are connected with a number of pairs of bit lines 6 and 7 and the pair of I/O lines 8 and 9 have a large capacitance load accordingly the I/O line 8 or 9 cannot be instantly charged up to the predetermined potential by the capacity of the I/O load 5. Thus, a little time is required for the I/O line 8 or 9 to attain the predetermined voltage $V_{ct}$.

In the fast page mode, a change of column addresses is permitted in a state in which the column address strobe signal $\overline{CAS}$ is at the high level, whereby a different column address can be selected. When the column address strobe signal $\overline{CAS}$ is at the high level, the read/write indicating signal $\overline{W}$ also attains the high level accordingly. As a result, the gates of the MOS transistors 12 and 13 of the I/O load 5 are opened and the I/O line 8 or 9 of the low level is charged. The charging takes a time $t_d$ because of the above described capacity of the I/O load 5.

A different column address is selected with the I/O line 8 or 9 being at a potential lower than $V_{ct}$ and if the potential on the bit line 6 or 7 corresponding to the newly selected column address is considerably different from the potential on the I/O line 8 or 9 (for example, if the I/O line 8 of the potential lower than $V_{ct}$ is coupled with the bit line 6 connected to the memory cell 2 in which "1" is stored), the pair of I/O lines 8 and 9 themselves function as a kind of a source because of the large capacitance load of the I/O lines 8 and 9. As a result, although the write data $D_{in}$ is not at all supplied to the write buffer 3, the output level of the sense amplifier 1 of the bit lines 6 and 7 is inverted. The inversion of the output level of the sense amplifier 1 causes erroneous writing of data in the memory cell 2. In the above described example, the data of "0" is erroneously written in the memory cell 2.

In order to prevent such errors, the column address cannot be changed during the period $t_d$ after the column address strobe signal $\overline{CAS}$ attains the high level until the potential of the I/O line 8 or 9 rises to the predetermined potential $V_{ct}$ and it is necessary to wait for a lapse of this period $t_d$. Accordingly, a delay is caused in timing for permitting a change of the column address. In other words, there is caused a delay in access time of the column address.

In the static column mode, when the write enable signal R/W attains the high level, a change of the column address is permitted, but there is also caused a delay in access time of the column address for the same reason as described above.

SUMMARY OF THE INVENTION

In view of the above described prior art, an object of the present invention is to provide a dynamic RAM in which a change of column address is permitted immediately after an end of a writing cycle and accordingly a column address can be accessed rapidly in a shorter period than that in a conventional dynamic RAM.

According to the present invention, a dynamic RAM comprises: a plurality of word lines; a plurality of bit lines intersecting with the word lines; a plurality of memory cells provided in intersections of the word lines and the bit lines; an addressing circuit for selecting a word line and a bit line intersecting a selected memory cell; I/O lines connected with the bit lines for reading and writing data from and into the memory cells; an I/O load connected between the I/O lines and a voltage source; a write buffer for providing the I/O lines with the write voltage for writing data into the memory cells; and a monostable multivibrator responsive to the leading edge of a pulse in a read/write indicating signal, for providing an effective read/write signal pulse having a shorter duration than that of the read/write indicating signal pulse, wherein the effective read/write signal pulse not only causes the I/O load to disconnect the I/O lines from the voltage source but also causes the write buffer to provide the write voltage through the I/O lines to the bit line selected by the addressing circuit and then the addressing circuit is not allowed to change the selection of the memory cells during the duration of the read/write indicating signal pulse.

In the dynamic RAM in accordance with the present invention, charging of the I/O lines is restarted before an end of a writing cycle and accordingly a time margin is allowed for a charging period of the I/O lines. Thus, the I/O lines have been already sufficiently charged at the end of the writing cycle and it becomes possible to change column address immediately after the end of the writing cycle, whereby a quick access function such as a fast page mode or the like can be efficiently performed.

These objects and other objects, features, aspects and advantages of the present invention will become more apparent from the following detailed description of the present invention when taken in conjunction with the accompanying drawings.

DESCRIPTION OF THE PREFERRED EMBODIMENT

Figure 3:
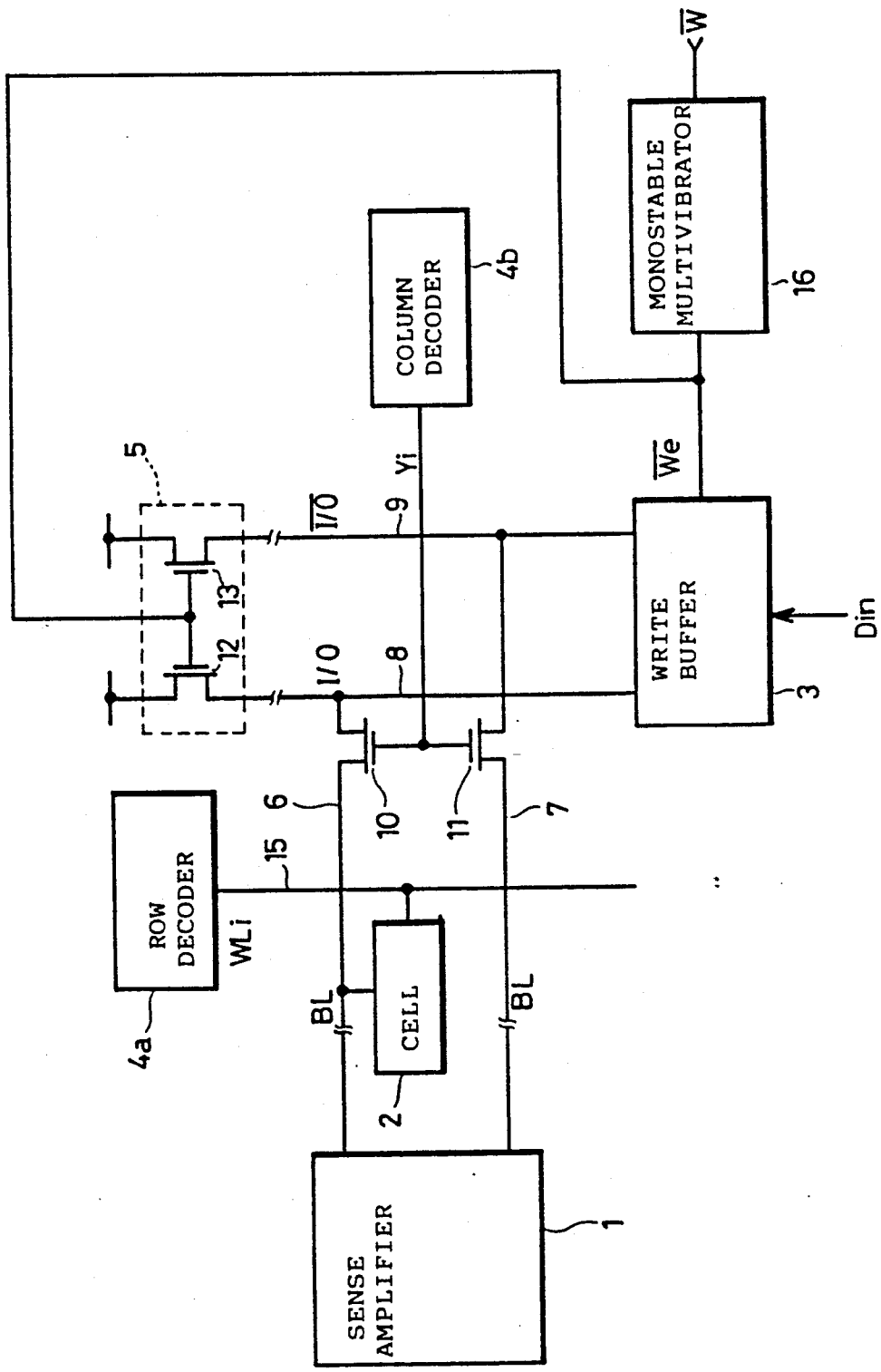
FIG. 3 is a circuit diagram of a main part of a dynamic RAM according to an embodiment of the present invention.

FIG. 3 is a circuit diagram showing a main part of a dynamic RAM according to an embodiment of the present invention. The dynamic RAM of FIG. 3 is similar to that of FIG. 1, except that a monostable multivibrator 16 is provided in the dynamic RAM of FIG. 3. In FIG. 3, the same reference characters as in FIG. 1 denote the corresponding portions.

A characteristic feature of this embodiment is as follows. The dynamic RAM is provided with the monostable multivibrator 16 which receives a read/write indicating signal $\overline{W}$ for indicating reading and writing data from and into the memory cell 2 and outputs an effective read/write signal $\overline{We}$ having a smaller pulse duration than that of the signal $\overline{W}$ in response to a down edge of the signal $\overline{W}$ as a trigger, so that the output signal $\overline{We}$ of the monostable multivibrator 16 is supplied as a control signal for rendering the I/O load 5 inactive.

Figure 4:
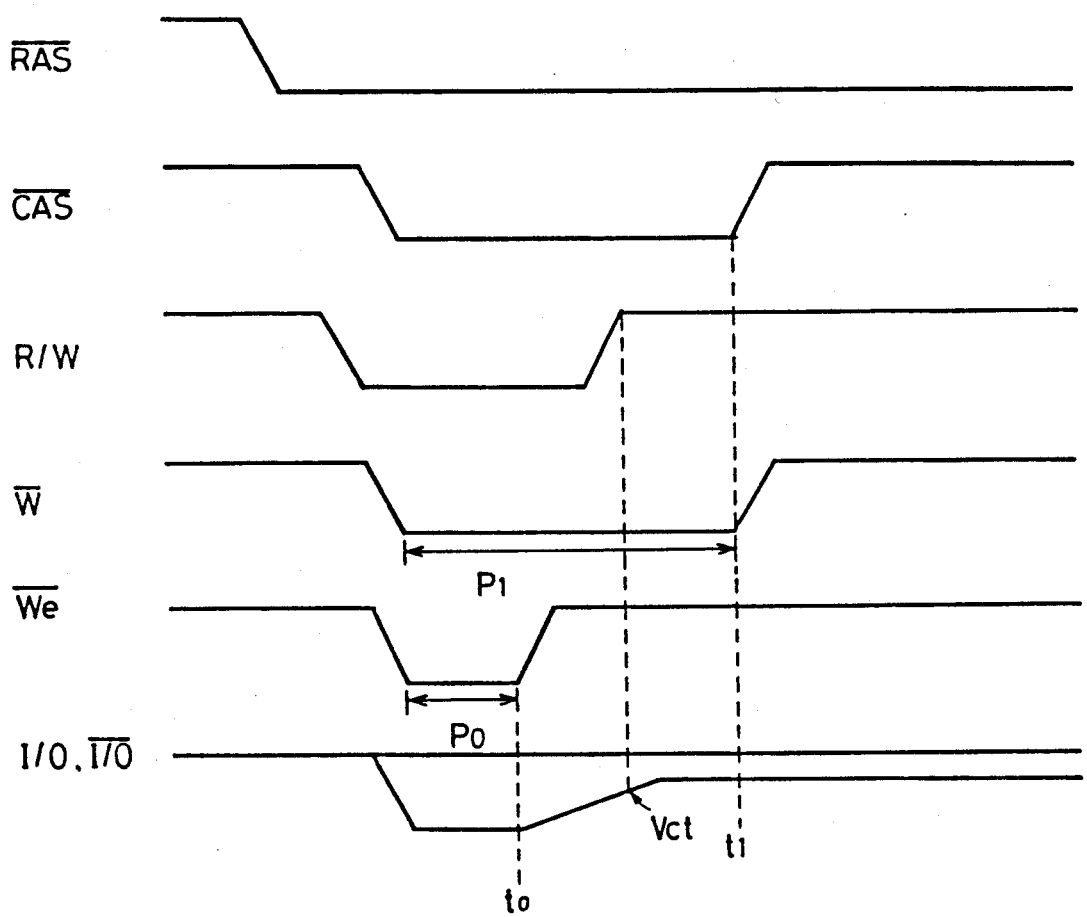
FIG. 4 is a timing chart for explaining operation of the dynamic RAM of FIG. 3.

Operation in a writing cycle of the dynamic RAM will be described by taking the fast page mode as an example, with reference to the flow chart of FIG. 4.

Figure 1:
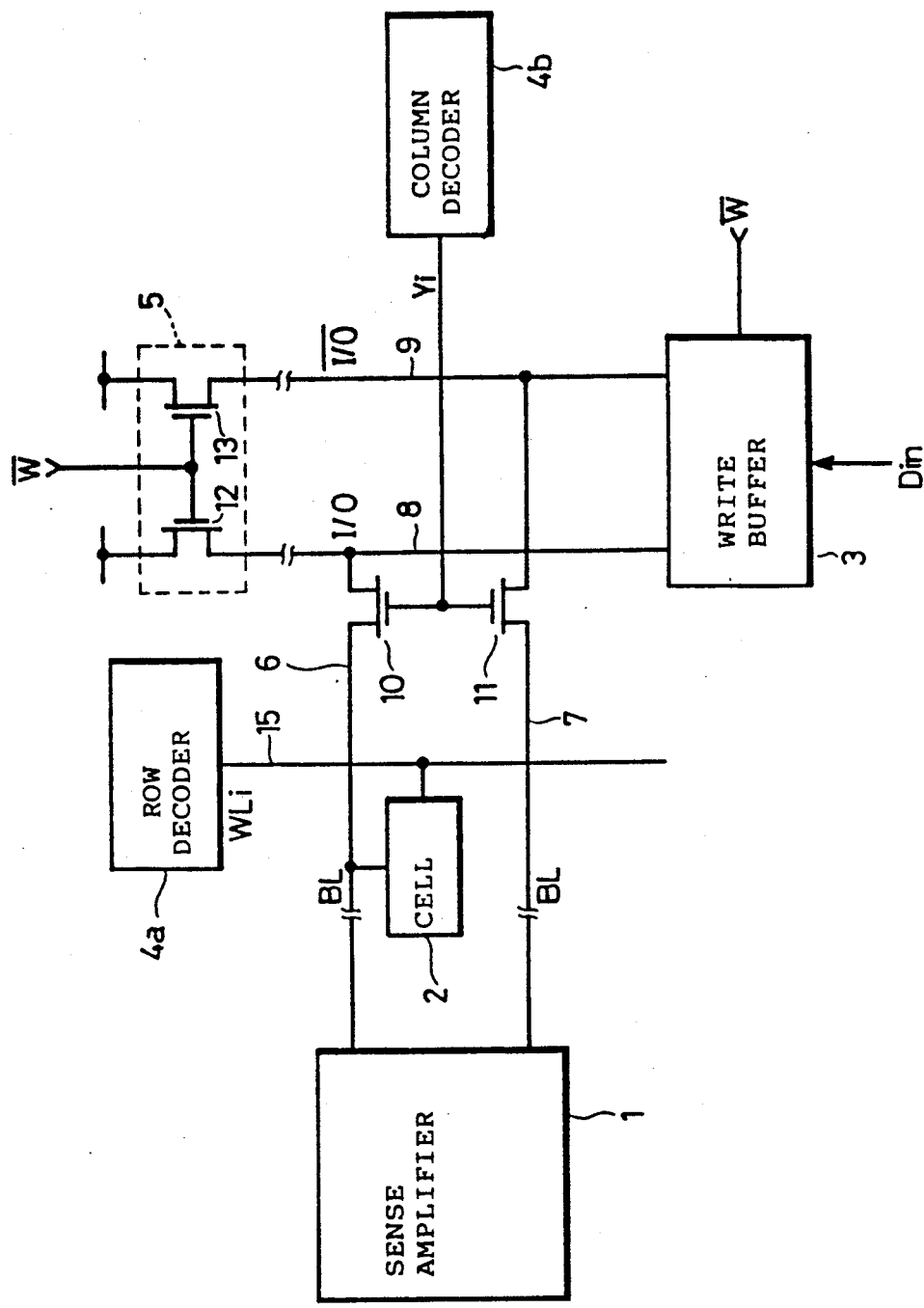
FIG. 1 is a circuit diagram of a main part of a conventional dynamic RAM.
Figure 2:
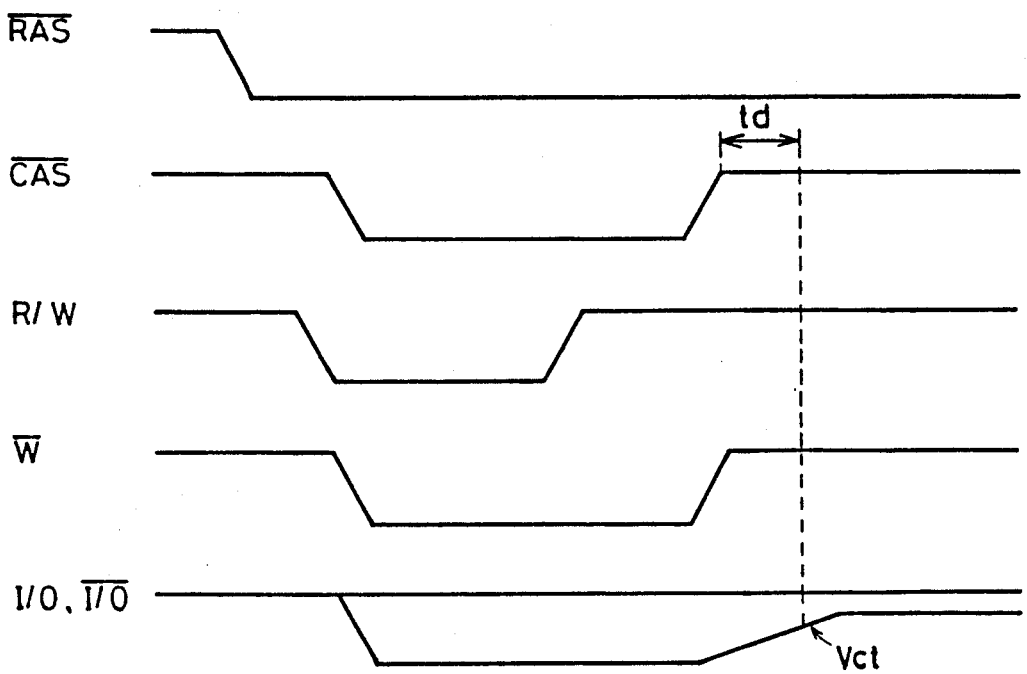
FIG. 2 is a timing chart for explaining operation of the dynamic RAM of FIG. 1.

In the dynamic RAM of FIG. 3, operation including activation of the sense amplifier 1 to amplify the potential difference between the bit lines 6 and 7 and coupling of the pair of bit lines 6 and 7 and the pair of I/O lines 8 and 9 is performed in the same manner as in the case of the conventional dynamic RAM shown in FIG. 1. Therefore, detailed description thereof is omitted.

When the write enable signal R/W from the CPU is turned to the low level, the read/write indicating signal $\overline{W}$ in the dynamic RAM is turned to the low level in response thereto. At a down edge of the signal $\overline{W}$ as a trigger, the monostable multivibrator 16 outputs the effective read/write signal $\overline{We}$ having a smaller pulse duration than that of the read/write indicating signal $\overline{W}$. Since the effective read/write signal $\overline{We}$ is supplied commonly to the gates of the MOS transistors 12 and 13 of the I/O load 5 and to the write buffer 3, the I/O load 5 is rendered inactive only during a period in which the signal $\overline{We}$ is maintained at the low level. Thus, the pair of I/O lines 8 and 9 are disconnected from the DC source and the write buffer 3 is activated. At that time, if write data $D_{in}$ is supplied to the write buffer 3, the write buffer 3 sets one of the I/O lines 8 and 9 to a high level near the source potential Vcc and sets the other to a low level equal to the ground potential GND, dependent on "0" or "1" of the data $D_{in}$. As a result, writing of the data in the memory cell 2 is completed.

Since a pulse duration $P_0$ of the effective read/write signal $\overline{We}$ is shorter than a pulse duration $P_1$ of the read/write indicating signal $\overline{W}$, the signal $\overline{We}$ is immediately returned to the high level after writing of data is executed. Consequently, the I/O load 5 is activated and the I/O line 8 or 9 starts to be charged (at time $t_0$ in FIG. 4). Accordingly, when the column address strobe signal $\overline{CAS}$ attains the high level (at time $t_1$ in FIG. 4), that is, when a writing cycle is completed, column address can be changed immediately after the end of the writing cycle since the I/O line 8 or 9 is already sufficiently charged at a predetermined potential level $V_{cr}$.

Although the fast page mode of the present embodiment was described, the present invention is also applicable to other modes for performing the quick access function, such as a static column mode or a nibble mode.

In addition, although the columns in the present invention were described as being formed by N channel MOS transistors, they may be formed by P channel MOS transistors.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. In a dynamic RAM device comprising a plurality of word lines and a plurality of bit line pairs interconnecting with said word lines, and memory cells at intersections of said word lines and said bit line pairs, addressing means for selecting a word line and a bit line pair to access a predetermined memory cell, I/O lines for supplying data to and obtaining data from said bit line pairs, write buffer means for supplying said I/O lines with a write voltage to be written as data into a selected memory cell, and I/O lines control means for connecting selectively a source of predetermined voltage to said I/O lines, means responsive to a leading edge of a read-write indicating signal ($\overline{W}$) for generating an effective read-write signal ($\overline{We}$) having a duration that is shorter than that of said read-write indicating signal ($\overline{W}$), said write buffer means receiving said effective read-write signal ($\overline{We}$) and supplying said write voltage to said I/O lines only during the duration of said effective read-write signal; and said I/O lines control means receiving said effective read-write signal ($\overline{We}$) and isolating said I/O lines from said source of predetermined voltage only during the duration of said effective read-write signal ($\overline{We}$).

2. In the dynamic RAM device in accordance with claim 1, said read-write indicating signal having a predetermined duration, said I/O lines control means including means for isolating said I/O lines from said source of predetermined voltage during a first portion of the duration of said read-write indicating signal for precharging said I/O lines during a second portion of the duration of said read-write indicating signal.

3. A method of writing data to a dynamic RAM device comprising a plurality of word lines and a plurality of bit line pairs intersecting with said word lines and memory cells at intersections of said word lines and said bit line pairs, means for receiving a read-write indicating signal ($\overline{W}$), addressing means for selecting a word line and a bit line pair to access a predetermined memory cell, I/O lines for supplying data to and obtaining data from said bit lines pairs, write buffer means for supplying said I/O lines with a write voltage to be written as data into a selected memory cell and I/O lines control means for connecting selectively a source of predetermined voltage to said I/O lines, the method comprising the steps of:

detecting a leading edge of said read-write indicating signal ($\overline{W}$), and in response, generating an effective read-write signal ($\overline{We}$) having a duration that is shorter than that of said read-write indicating signal ($\overline{W}$); and, during only the duration of said effective read-write signal ($\overline{We}$), (1) controlling said write buffer means to supply said write voltage to said I/O lines, and (2) controlling said I/O lines control means to isolate said I/O lines from said source of predetermined voltage.

4. The method of claim 3, wherein said read-write indicating signal has a predetermined duration, comprising the further steps of:

isolating said I/O lines from said source of predetermined voltage during a first portion of the duration of said read-write indicating signal, and precharging said I/O lines during a second portion of the duration of said read-write indicating signal.

5. A method of writing data to a dynamic RAM device comprising a plurality of word lines and a plurality of bit line pairs intersecting with said word lines and memory cells at intersections of said word lines and said bit line pairs, means for receiving a read-write indicating signal ($\overline{W}$), addressing means for selecting a word line and a bit line pair to access a predetermined memory cell, I/O lines for supplying data to and obtaining data from said bit lines pairs and means for supplying a source of predetermined voltage to said I/O lines, the method comprising the steps of:

detecting a leading edge of said read-write indicating signal ($\overline{W}$) and in response, generating an effective read-write signal ($\overline{We}$) having a duration that is shorter than that of said read-write indicating signal ($\overline{W}$), and during only the duration of said effective read-write signal ($\overline{We}$), (1) supplying a write voltage to said I/O lines, and (2) isolating said I/O lines from said source of predetermined voltage; and thereafter, controlling said addressing means to select a different memory cell, whereby said addressing means does not change the selection of said memory cells during the duration of the read-write indicating signal ($\overline{W}$).

6. The method of claim 5, wherein said read-write indicating signal has a predetermined duration, comprising the further steps of:

isolating said I/O lines from said source of predetermined voltage during a first portion of the duration of said read-write indicating signal, and precharging said I/O lines during a second portion of the duration of said read-write indicating signal.

* * * * *